United States Patent
Chen et al.

(10) Patent No.: US 7,518,687 B2
(45) Date of Patent: Apr. 14, 2009

(54) PIXEL STRUCTURE AND ACTIVE MATRIX SUBSTRATE

(75) Inventors: Yi-Jen Chen, Tainan (TW); Cheng-Han Tsao, Taipei County (TW); Wei-Kai Huang, Tainan (TW); Ming-Chou Wu, Nantou County (TW); Chen-Shun Tsai, Taipei (TW); Chiung-Pin Wang, Changhua (TW); Yi-Pai Huang, Chiayi (TW)

(73) Assignee: Au Optronics Corporation, Hsinchu (TW)

( * ) Notice: Subject to any disclaimer, the term of this patent is extended or adjusted under 35 U.S.C. 154(b) by 619 days.

(21) Appl. No.: 11/162,764

(22) Filed: Sep. 22, 2005

(65) Prior Publication Data

US 2006/0262237 A1 Nov. 23, 2006

(30) Foreign Application Priority Data

May 18, 2005 (TW) ............................... 94116051 A

(51) Int. Cl.
*G02F 1/1343* (2006.01)
(52) U.S. Cl. ......................................... 349/139; 349/48
(58) Field of Classification Search .................... 349/48, 349/139
See application file for complete search history.

(56) References Cited

U.S. PATENT DOCUMENTS 5,777,700 A    7/1998  Kaneko et al. ................ 349/39
6,198,516 B1 *  3/2001  Kim et al. ..................... 349/39

FOREIGN PATENT DOCUMENTS

CN    1622149    6/2005

* cited by examiner

*Primary Examiner*—David Nelms
*Assistant Examiner*—Phu Vu
(74) *Attorney, Agent, or Firm*—Jianq Chyun IP Office

(57) ABSTRACT

A pixel structure electrically connected to a scan line and a data line, includes an active device, a first pixel electrode, a second pixel electrode, a capacitor coupling electrode and a charge releasing device. The active device is electrically connected to the scan line and the data line. The second pixel electrode is electrically isolated from the first pixel electrode. The capacitor coupling electrode is disposed under the second pixel electrode and electrically connected to the data line through the active device. The charge releasing device is electrically connected to the second pixel electrode. The above-described pixel structure is able to effectively solve the image sticking problem. In addition, further provides an active matrix substrate which is able to avoid the image sticking effect.

20 Claims, 10 Drawing Sheets

PIXEL STRUCTURE AND ACTIVE MATRIX SUBSTRATE

CROSS-REFERENCE TO RELATED APPLICATION

This application claims the priority benefit of Taiwan application serial no. 94116051, filed on May 18, 2005. All disclosure of the Taiwan application is incorporated herein by reference.

BACKGROUND OF THE INVENTION

1. Field of Invention

The present invention relates to a pixel structure and an active matrix substrate and, more particularly, to a pixel structure and an active matrix substrate capable of avoiding image sticking phenomenon.

2. Description of the Related Art

Nowadays, it is the trend that a TFT-LCD (thin film transistor liquid crystal display) should have the characteristics such as high contrast ratio, no gray scale inversion, little color shift, high luminance, high color richness, high color saturation, fast response and wide viewing angle. Among the wide viewing technologies, there are a few types of LCDs, such as TN+FILM (twisted nematic LCD plus wide viewing film), IPS-LCD (in-plane switching LCD), FFS-LCD (fringe field switching LCD) and MVA TFT-LCD (multi-domain vertical alignment thin film transistor-LCD).

FIG. 1 is a schematic section drawing of a conventional MVA TFT-LCD panel. Referring to FIG. 1, a conventional MVA TFT-LCD panel 100 includes a TFT array substrate 110, a color filter substrate 120 and a liquid crystal layer 130 located between the TFT array substrate 110 and the color filter substrate 120. The TFT array substrate 110 has a plurality of pixel electrodes 112 with slits 112a. The color filter substrate 120 includes a common electrode 122 and a plurality of alignment protrusions 124 disposed on the common electrode 122. Since the liquid crystal molecules of the LC layer 130 can be arranged in multi-directions by the alignment protrusions 124 disposed on the common electrode 122 and the slits 112a formed in the pixel electrodes 112, a plurality of different domains A and B are formed. In this way, the requirement of wide viewing angle can be obtained by the MVA TFT-LCD panel 100. Remarkably, within a single pixel structure, the LC capacitances (liquid crystal capacitance) Clc in the domain A and the domain B are the same. On the other hand, as a viewer sees the MVA TFT-LCD panel 100 from different angles, the corresponded transmittance-gray level curves are varied with the angles. In other words, when a viewer sees from a different angle, the brightness (gray level) displayed by the conventional MVA TFT-LCD panel 100 varies, which results in color washout phenomenon.

FIGS. 2A and 2B are schematic section drawings of another conventional MVA TFT-LCD panel. Referring to FIGS. 2A and 2B, to avoid the above-mentioned color washout phenomenon, another conventional MVA TFT-LCD panel 200 has been developed, which includes a TFT array substrate 210, a color filter substrate 220 and a liquid crystal layer 230 located between the TFT array substrate 210 and the color filter substrate 220. The TFT array substrate 210 has a plurality of pixel electrodes 212 and floating pixel electrodes 214. The pixel electrodes 212 and the floating pixel electrodes 214 have slits (not shown in the figures). The color filter substrate 220 includes a common electrode 222 and a plurality of alignment protrusions 224 disposed on the common electrode 222.

Note that the pixel electrodes 212 and the floating pixel electrodes 214 are electrically isolated from each other in every single pixel structure. When the MVA TFT-LCD panel 200 is driven to display images, the pixel electrode 212 is coupled to a voltage level Vdata, and the floating pixel electrode 214 keeps a voltage level Vcc by capacitor coupling effect (C.C.), wherein Vdata>Vcc. The MVA TFT-LCD panel 200 is accordingly divided into a domain A, a domain B, a domain A' and a domain B'. Thus, in a single pixel structure, the pixel electrode 212 and the floating pixel electrode 214 have different voltage levels for compensating color saturation while the pixel structure is driven by the same signal. The LC capacitance over the pixel electrode 212 keeps Clc1 (corresponding to the domains A and B) herein, while the LC capacitance over the pixel electrode 214 keeps Clc2 (corresponding to the domains A' and B'), and Clc1>Clc2.

As shown in FIG. 2B, since the floating pixel electrode 214 is electrically floated, during the MVA TFT-LCD panel 200 is being driven, the charges are easily trapped in an alignment film PI if an unbalance between positive charges and negative charges is present. Thus, the voltage level of the floating pixel electrode 214 is accordingly shifted, which causes a serious image sticking phenomenon in the above-described wide viewing technologies.

SUMMARY OF THE INVENTION

The present invention is directed to provide a pixel structure to effectively avoid image sticking phenomenon.

The present invention is directed to provide an active matrix substrate to effectively avoid image sticking phenomenon.

The present invention provides a pixel structure electrically connected to a scan line and a data line. The pixel structure includes an active device, a first pixel electrode, a second pixel electrode, a capacitor coupling electrode and a charge releasing device. The active device is electrically connected to the scan line and the data line. The first pixel electrode is electrically connected to the data line through the active device. The second pixel electrode is electrically isolated from the first pixel electrode. The capacitor coupling electrode is disposed under the second pixel electrode and electrically connected to the data line through the active device. The charge releasing device is electrically connected to the second pixel electrode.

The present invention provides an active matrix substrate, which includes a substrate, a plurality of scan lines, a plurality of data lines and a plurality of the above-described pixel structures. The scan lines, the data lines and the pixel structures are disposed on the substrate, wherein the pixel structures are corresponding to the scan lines and the data lines.

In an embodiment of the present invention, the charge releasing device is, for example, a capacitor. The capacitor is formed by, for example, an upper electrode electrically connected to the second pixel electrode and a lower electrode disposed under the upper electrode. The lower electrode has the substantially identical to the voltage level as that of the scan lines. In an embodiment of the present invention, the capacitor is formed by a partial region of the scan line and a partial region of the second pixel electrode. More specifically, the second pixel electrode has a protrusion located over a partial region of the scan line, and the capacitor is formed by the partial region of the scan line and the protrusion.

In an embodiment of the present invention, the charge releasing device (capacitor) of a pixel structure locates, for example, over the scan line which drives the pixel structure, or over the next scan line, or over both of the described locations.

In an embodiment of the present invention, the active device is, for example, a first TFT (thin film transistor). The first TFT includes, for example, a first gate electrode, a first channel layer, a first source electrode and a first drain electrode. The first gate electrode is electrically connected to the scan line. The first source electrode is electrically connected to the data line. The first drain electrode is electrically connected to the first pixel electrode.

In an alternative embodiment of the present invention, the charge releasing device is, for example, a second thin film transistor (TFT) and the ratio of the width over length (W/L) of the second TFT is substantially smaller than the (W/L) of the first TFT. Moreover, the second TFT includes, for example, a second gate electrode, a second channel layer, a second source electrode and a second drain electrode. The second gate electrode is electrically connected to the scan line. The second source electrode is electrically connected to the data line. The second drain electrode is electrically connected to the second pixel electrode.

In an embodiment of the present invention, the first pixel electrode and the second pixel electrode have, for example, jagged slits.

Since the charge releasing device (capacitor or TFT) is used in the present invention, the charge accumulation in the pixel structure can be effectively reduced while pixel structure is driven.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve for explaining the principles of the present invention.

FIG. 3' is a top view of another pixel structure according to the first embodiment of the present invention.

FIG. 6' is a top view of another pixel structure according to the second embodiment of the present invention.

DESCRIPTION OF THE EMBODIMENTS

In the following, the embodiments of the present invention regarding a pixel structure with a charge releasing device and an active matrix substrate to overcome the image sticking phenomenon are described. To solve the image sticking phenomenon, at least one charge releasing device is utilized in the pixel structure or the active matrix substrate to avoid charge accumulation herein.

First Embodiment

Figure 1:
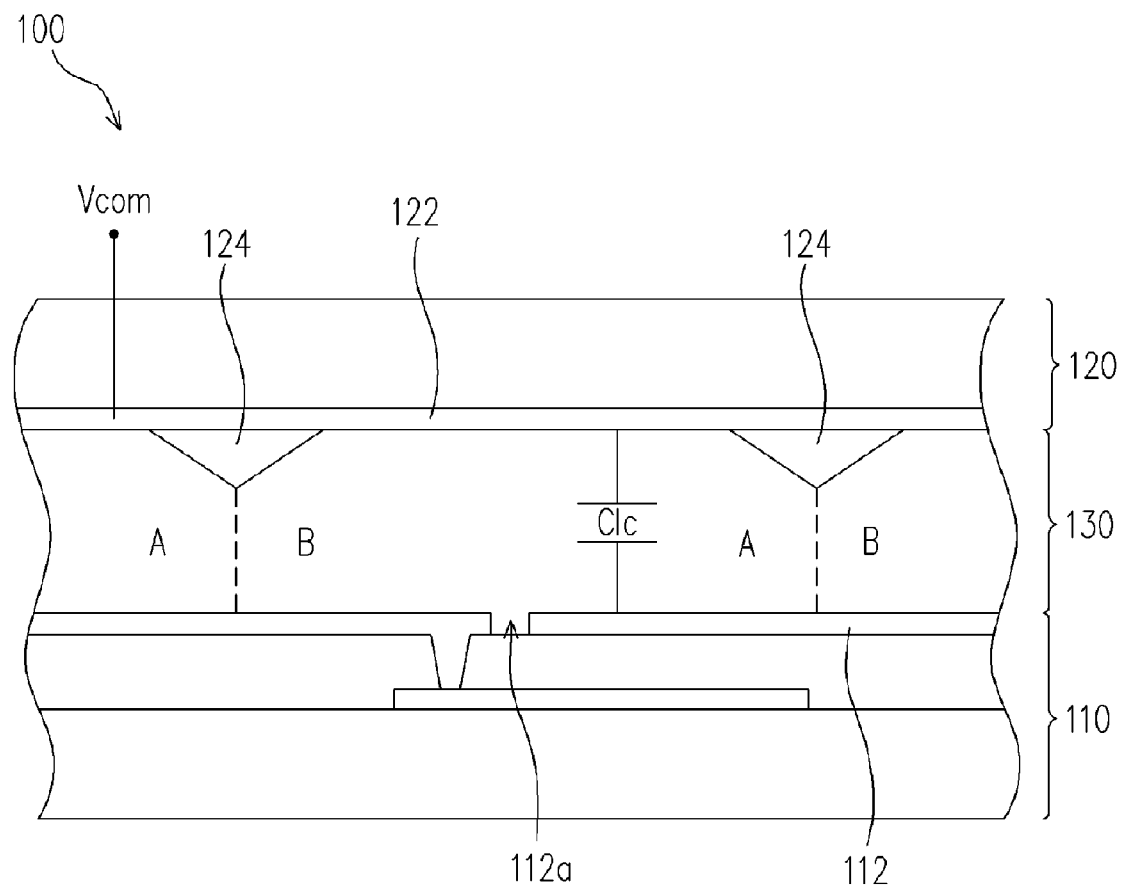
FIG. 1 is a schematic section drawing of a conventional MVA TFT-LCD panel.
Figure 2A:
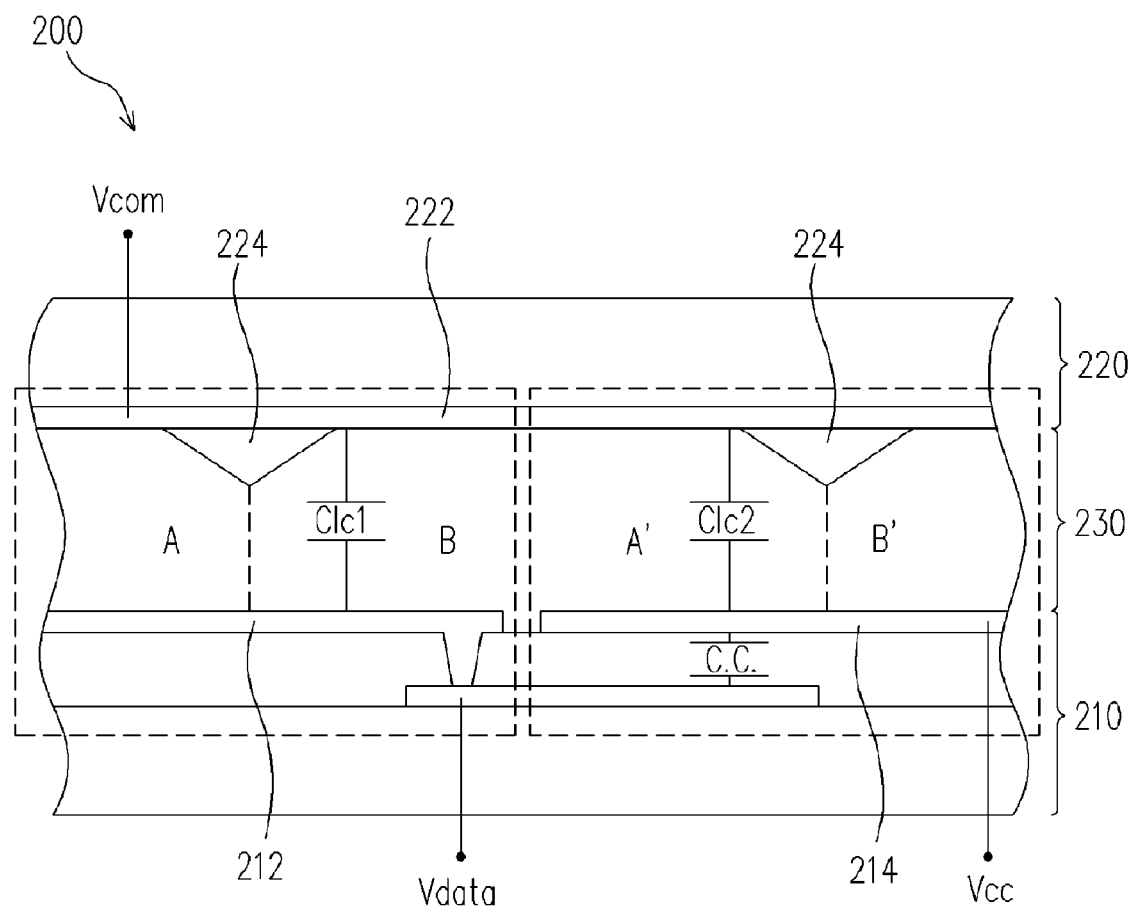
FIGS. 2A and 2B are schematic section drawings of another conventional MVA TFT-LCD panel.
Figure 2B:
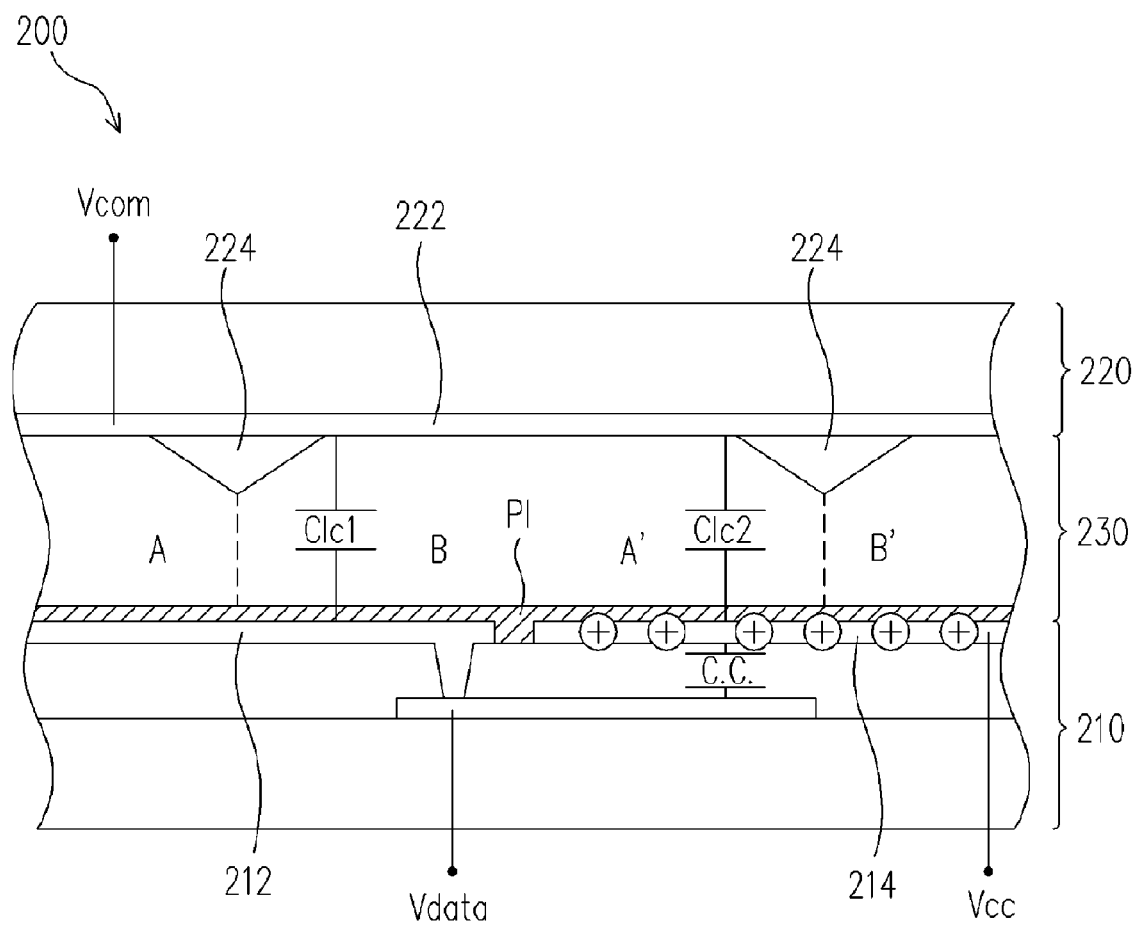
Figure 3:
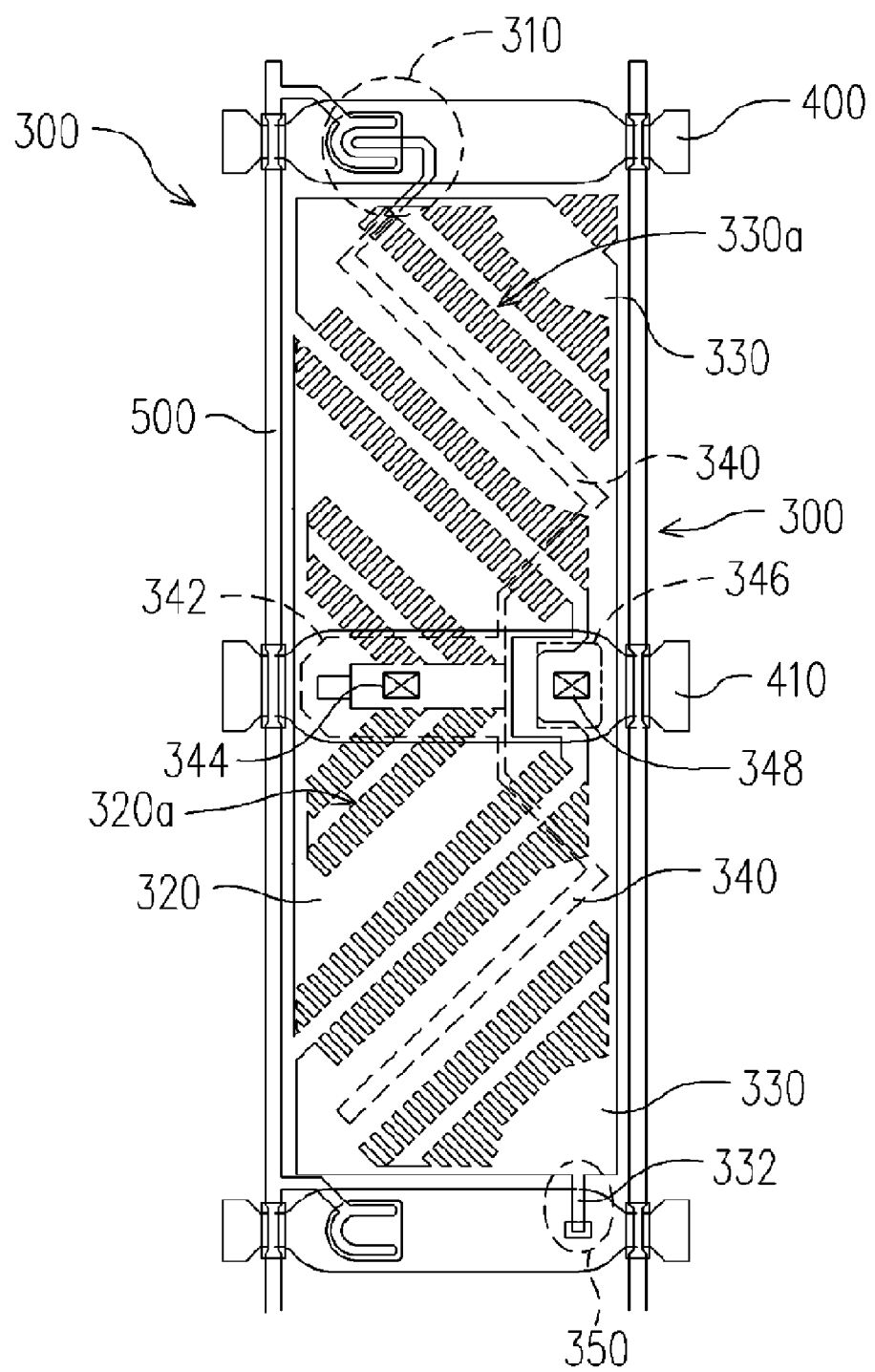
FIG. 3 is a top view of a pixel structure according to the first embodiment of the present invention.
Figure 3:
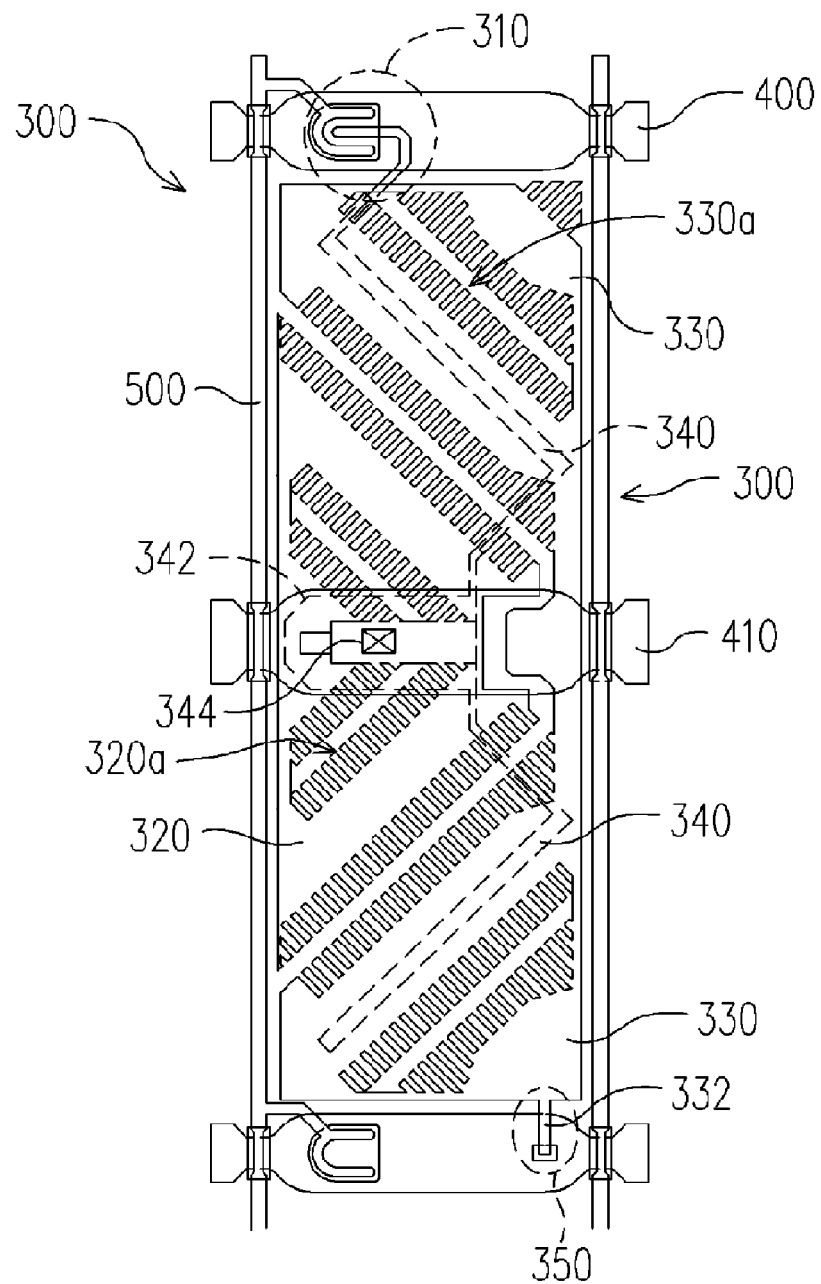

FIG. 3 is a top view of a pixel structure according to the first embodiment of the present invention. Referring to FIG. 3, the pixel structure 300 of the embodiment is electrically connected to a scan line 400 and a data line 500. The pixel structure 300, as shown in FIG. 3, includes an active device 310, a first pixel electrode 320, a second pixel electrode 330, a capacitor coupling electrode 340 and a charge releasing device 350. The active device 310 is electrically connected to the scan line 400 and the data line 500. The first pixel electrode 320 is electrically connected to the data line 500 through the active device 310. The second pixel electrode 330 is electrically isolated from the first pixel electrode 320. The capacitor coupling electrode 340 is disposed under the second pixel electrode 330, and electrically connected to the data line 500 through the active device 310. The charge releasing device 350 is electrically connected to the second pixel electrode 330.

In the present embodiment, the first pixel electrode 320 has jagged slits 320a, and the second pixel electrode 330 has jagged slits 330a. The structures of the jagged slits 320a and 330a are used for aligning the liquid crystal molecules so as to achieve the purpose of wide viewing angle.

Figure 4:
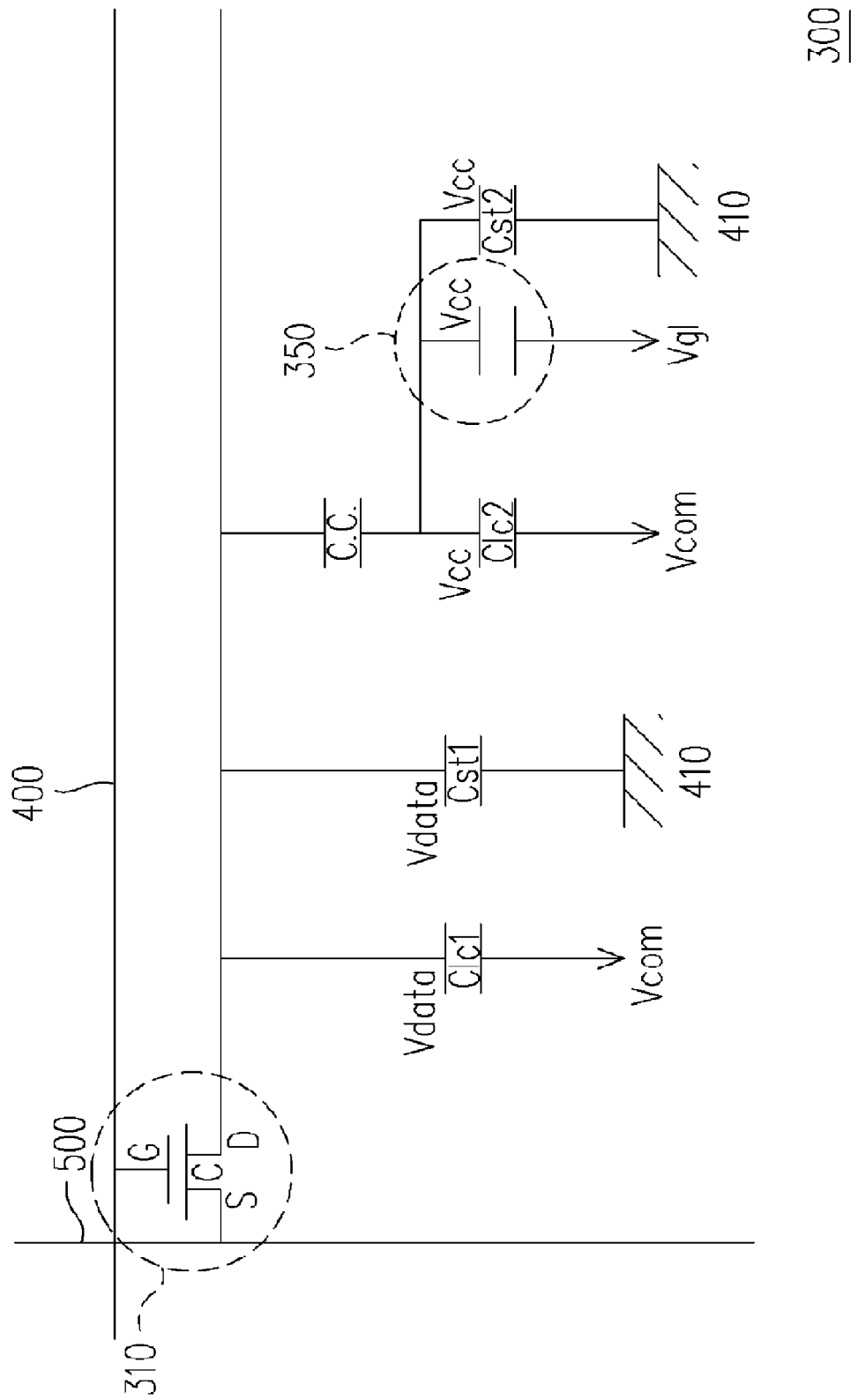
FIG. 4 is a circuit diagram of a pixel structure according to the first embodiment of the present invention.

FIG. 4 is a circuit diagram of a pixel structure according to the first embodiment of the present invention. Referring to FIG. 3 and FIG. 4, to keep a excellent display quality, the pixel structure 300 illustrated in the present embodiment further includes a storage capacitor Cst1 which is formed by, for example, a common electrode 410, an upper electrode 342 and a dielectric layer (for example, a gate insulating layer) between the common electrode 410 and the upper electrode 342. As shown in FIG. 3 and FIG. 4, the upper electrode 342 is connected to the capacitor coupling electrode 340. In addition, the upper electrode 342 is also electrically connected to the first pixel electrode 320 through a contact window 344 in a passivation layer (not shown). Except the storage capacitor Cst1, the pixel structure 300 of the embodiment further includes another storage capacitor Cst2 which is formed by, foe example, a common electrode 410, an upper electrode 346 and a dielectric layer (for example, a gate insulating layer) between the common electrode 410 and the upper electrode 346. The upper electrode 346 is connected to the second pixel electrode 330 through a contact window 348 in a passivation layer (not shown).

Referring to FIG. 3 and FIG. 4, the active device 310 in the embodiment of the present invention is, for example, a TFT (thin film transistor). The TFT has a gate electrode G, a channel layer C, a source electrode S and a drain electrode D. The gate electrode G is electrically connected to or integrated with the scan line 400, the source electrode S is electrically connected to or integrated with the data line 500. The drain electrode D is electrically connected to the first pixel electrode 320. Specifically, the drain electrode D in the embodiment of the present invention is electrically connected to the first pixel electrode 320 through the capacitor coupling electrode 340, the upper electrode 342 of the storage capacitor Cst1 and the contact window 344.

As shown in FIG. 3 and FIG. 4, to input an image data into the pixel structure 300, a high-voltage Vgh is provided to the scan line 400 for turning on the active device 310 (the gate electrode G of the TFT). Then, an image data Vdata from the data line 500 will be input into the first pixel electrode 320 through the active device 310 (i.e. the source electrode S, the channel layer C and the drain electrode D of the TFT), the capacitor coupling electrode 340, the upper electrode 342 of the storage capacitor Cst1 and the contact window 344 in the passivation layer (not shown). Thus, the first pixel electrode 320 maintains a voltage level Vdata. Meanwhile, due to a capacitor coupling effect (C.C.) of the capacitor coupling electrode 340, the second pixel electrode 330 is electrically coupled and has a voltage level Vcc, wherein the voltage level Vdata is larger than the voltage level Vcc. Therefore, in response to the same image data Vdata, the first pixel electrode 320 and the second pixel electrode 330 maintain two different voltage levels, respectively. Besides, an LC capacitor (liquid crystal capacitor) Clc1 is formed by the first pixel electrode 320, the liquid crystal layer and the common electrode with a voltage level Vcom on the opposite substrate (e.g. a color filter substrate). Further, another LC capacitor (liquid crystal capacitor) Clc2 is formed by the second pixel electrode 330, the liquid crystal layer and the common electrode with the voltage level Vcom on the opposite substrate.

Note that the charge releasing device 350 of the embodiment plays an important role in the pixel structure 300. More specifically, the charge releasing device 350 is able to prevent the charges from being trapped in an alignment film effectively. A detailed mechanism is described later with FIGS. 3, 4 and 5.

Referring to FIGS. 3 and 4, the charge releasing device 350 of the embodiment is, for example, a capacitor, which includes an upper electrode connected to the second pixel electrode 330, a lower electrode disposed under the upper electrode and a dielectric layer (for example, a passivation layer) between the upper electrode and the lower electrode. The lower electrode has the substantially identical to the voltage level as the voltage level of the scan line 400. Except the active device 310 is turned on, the voltage levels of the lower electrode and the scan lines 400 are both maintained at Vgl (for example, −6V). For the most time, the voltage level of the lower electrode is Vgl, and Vgl<Vdata. Therefore, the charge releasing device 350 is able to restrain the unbalance between positive charges and negative charges by capacitor coupling effect, which avoids the image sticking to occur.

As shown in FIG. 3, the capacitor of the embodiment is formed by a partial region of the scan line 400 and a partial region of the second pixel electrode 330. In more detail, the second pixel electrode 330 has a protrusion 332 disposed over the partial region of the scan line 400, and the capacitor is formed by the partial region of the scan line 400 and the protrusion 332. The design of the capacitor can be accomplished under minor modification of the process without increasing the production cost.

In the above-described pixel structure 300 as shown in FIG. 3, the charge releasing device 350 (capacitor) is disposed over the scan line 400 substantially corresponding to the driven pixel structure 300. Nevertheless, for those skilled in the art, it is easy to modify the location of the charge releasing device 350 to fit the applications.

For example, when a plurality of the above-described pixel structures 300 are arranged in an array to form an active matrix substrate, the charge releasing device 350 can be, for example, disposed over a next scan line, or over both the driving scan line and the next scan line. If the charge releasing device 350 is disposed over both the driving scan line and the next scan line, the capacitance of the capacitor is not sensitive to a mis-alignment in the process. In other words, the charge releasing capability of all individual charge releasing devices 350 (capacitors) are very close to each other.

Figure 5A:
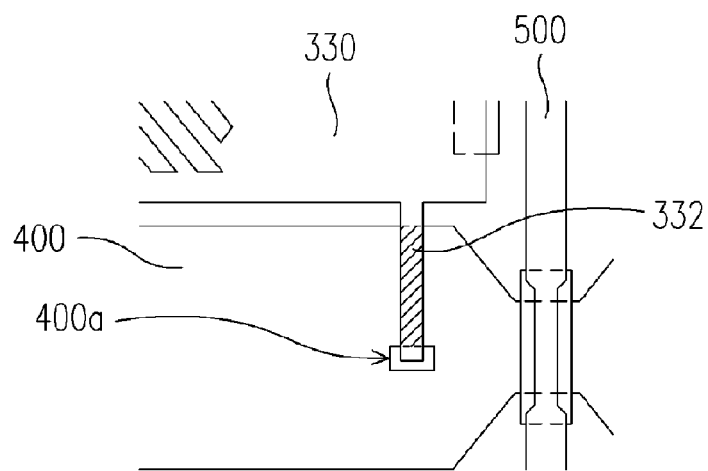
FIGS. 5A-5C are local enlargement drawings of the charge releasing device in FIG. 3.
Figure 5B:
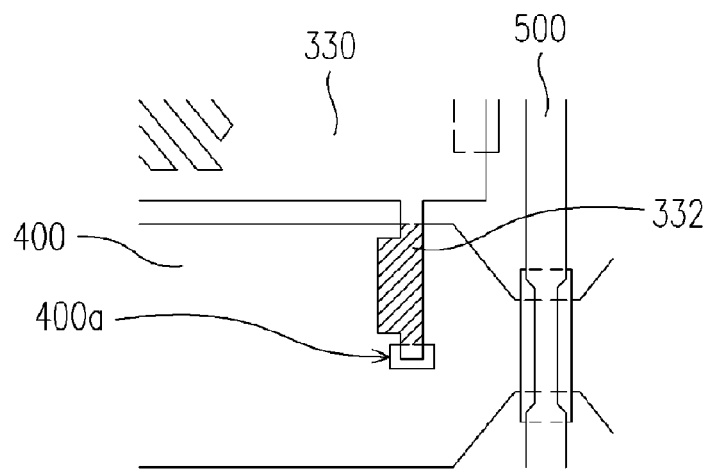
Figure 5C:
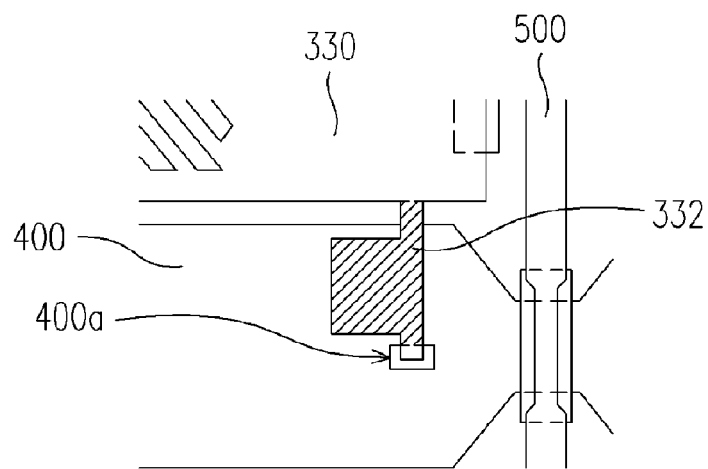

FIGS. 5A-5C are local enlargement drawings of the charge releasing device in FIG. 3. Referring to FIGS. 5A-5C, in the present embodiment, an opening 400a can be formed on the scan line 400 optionally. The opening 400a is located, for example, over the end of the corresponded protrusion 332. On the other hand, the end of the protrusion 332 is preferred not beyond the opening 400a. If there is a mis-alignment between the first pixel electrode 320 (shown in FIG. 3) and the second pixel electrode 330 in the process, which results in shifts in a horizontal direction or a vertical direction of the second pixel electrode 330, the overlap area (shown by slash lines) between the protrusion 332 and the scan line 400 still maintains constant. Thus, the charge releasing capability of all individual charge releasing devices 350 (capacitors) are still the same. The actual overlap area (shown by slash lines) between the protrusion 332 and the scan line 400 in the embodiment is specified according to product requirements, as shown in FIGS. 5A-5C.

FIG. 3' is a top view of another pixel structure according to the first embodiment of the present invention. Referring to FIGS. 3 and 3', the storage capacitor in the pixel structure 300 of the embodiment can be designed in various types. In the pixel structure 300 shown in FIG. 3, the storage capacitor formed by the upper electrode 342 and the common electrode 410 or the storage capacitor formed by the upper electrode 346 and the common electrode 410 is referred to as an MIM-type capacitor (metal-insulator-metal capacitor). In the pixel structure 300 of FIG. 3', however, the storage capacitor formed by the upper electrode 342 and the common electrode 410 is counted referred to as an MIM-type capacitor, while the storage capacitor formed by the second pixel electrode 330 and the common electrode 410 is referred to as an MII-type capacitor (metal-insulator-ITO capacitor), wherein ITO is an acronym of indium-tin-oxide. In the pixel structure 300 of FIG. 3', the upper electrode 346 is omitted. Similarly, for those skilled in the art, it is easy to modify the type and the location of the storage capacitor to fit the applications.

Second Embodiment

Figure 6:
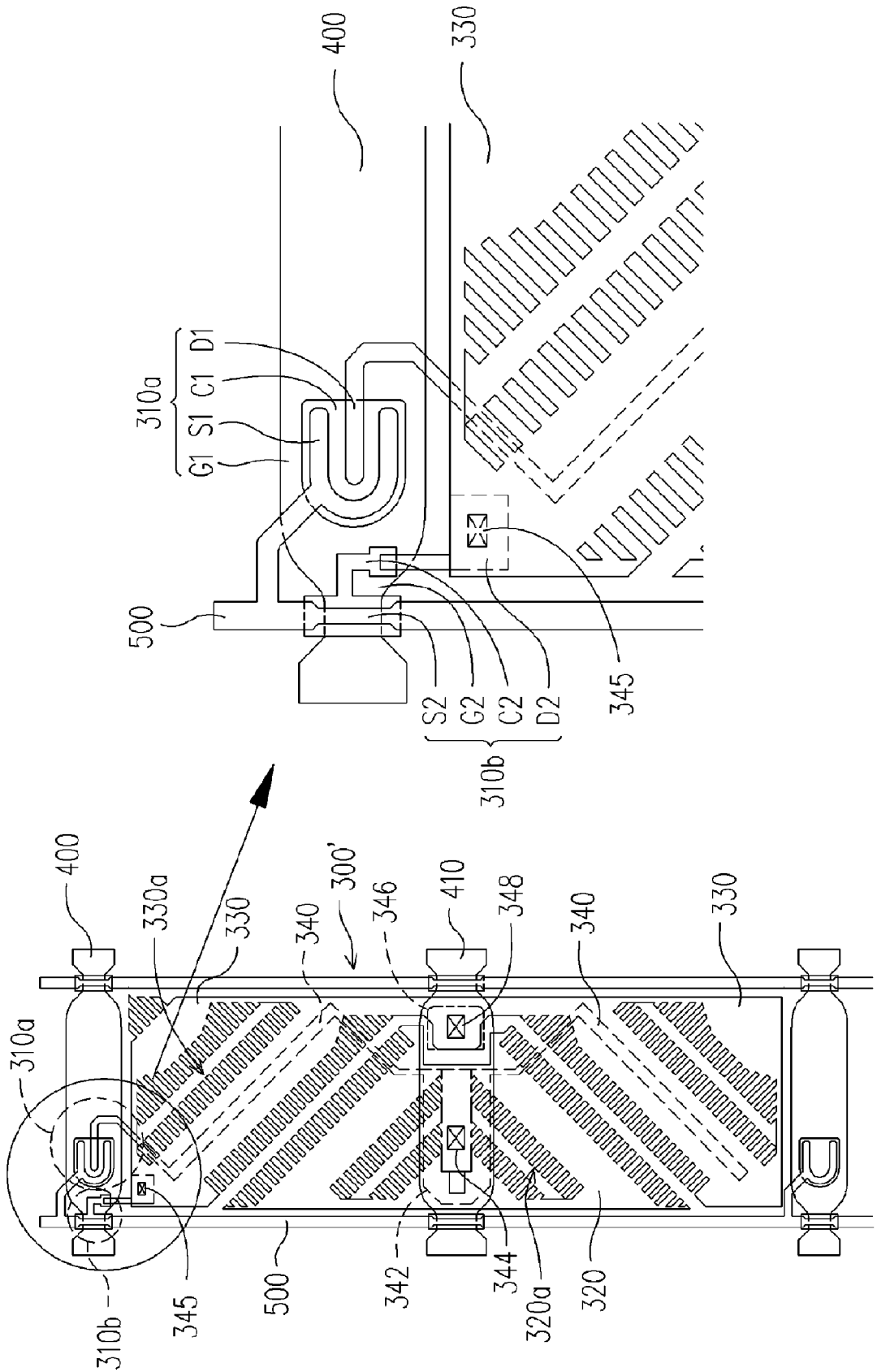
FIG. 6 is a top view of a pixel structure according to the second embodiment of the present invention.
Figure 6:
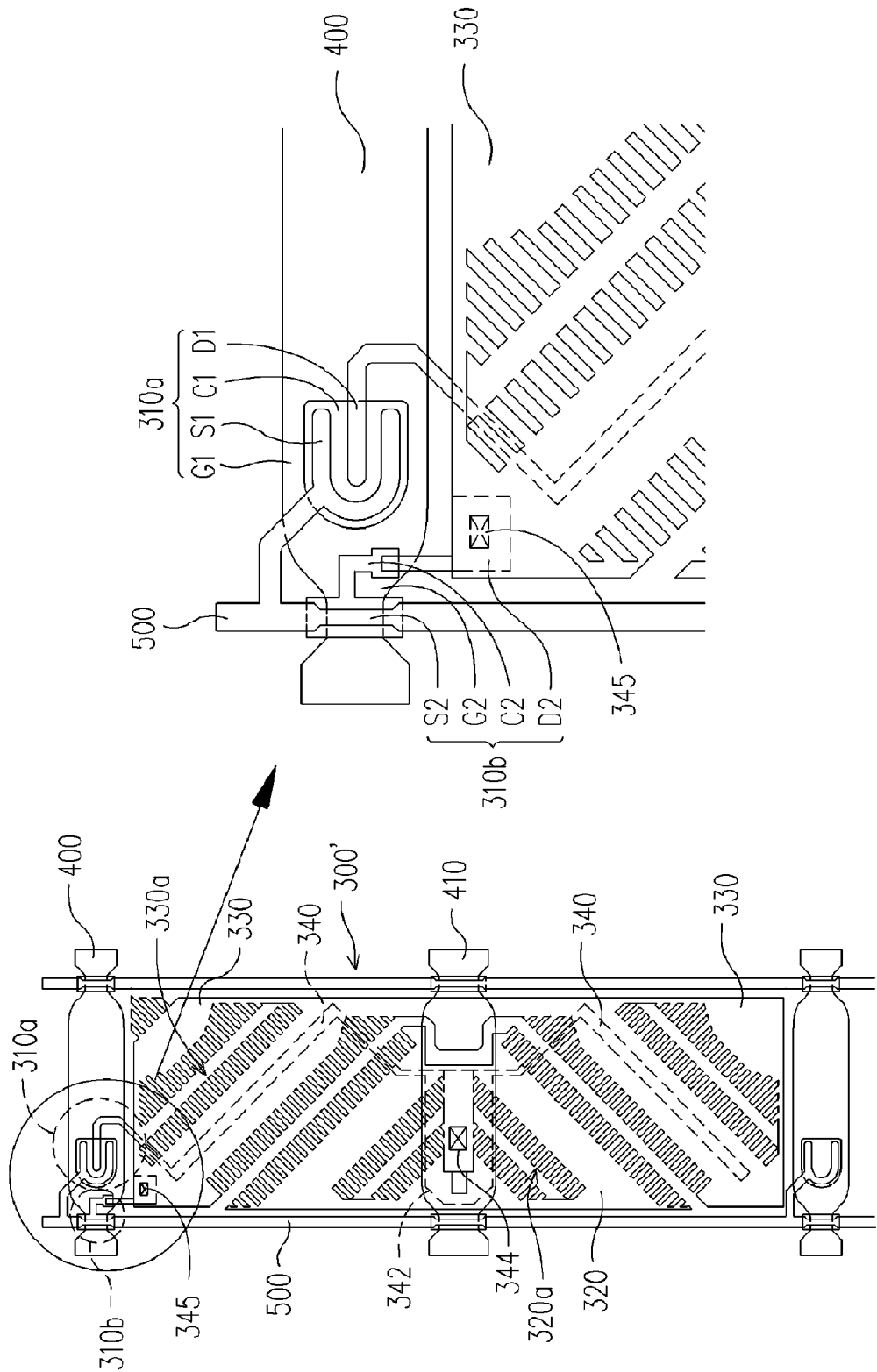

FIG. 6 is a top view of a pixel structure according to the second embodiment of the present invention. The pixel structure 300' of the embodiment is similar to the pixel structure 300 in the first embodiment except that the pixel structure 300' is electrically controlled by a first TFT 310a (thin film transistor) and a second TFT 310b. The first TFT 310a is electrically connected to a first pixel electrode 320 while the second TFT 310b is electrically connected to a second pixel electrode 330. The ratio of the width over length (W/L) of the second TFT 310b is substantially smaller than the (W/L) of the first TFT 310a.

The first TFT 310a in the second embodiment has, for example, a first gate electrode G1, a first channel layer C1, a first source electrode S1 and a first drain electrode D1. The first gate electrode G1 is electrically connected to or integrated with the scan line 400. The first source electrode S1 is electrically connected to or integrated with the data line 500. The first drain electrode D1 is electrically connected to the first pixel electrode 320. Specifically, the second TFT 310b in the embodiment of the present invention can be considered as a charge releasing device. The second TFT 310b has, a second gate electrode G2, a second channel layer C2, a second source electrode S2 and a second drain electrode D2. The second gate electrode G2 is electrically connected to the scan line 400. The second source electrode S2 is electrically connected to the data line 500. The second drain electrode D2 is electrically connected to the second pixel electrode 330.

Figure 7:
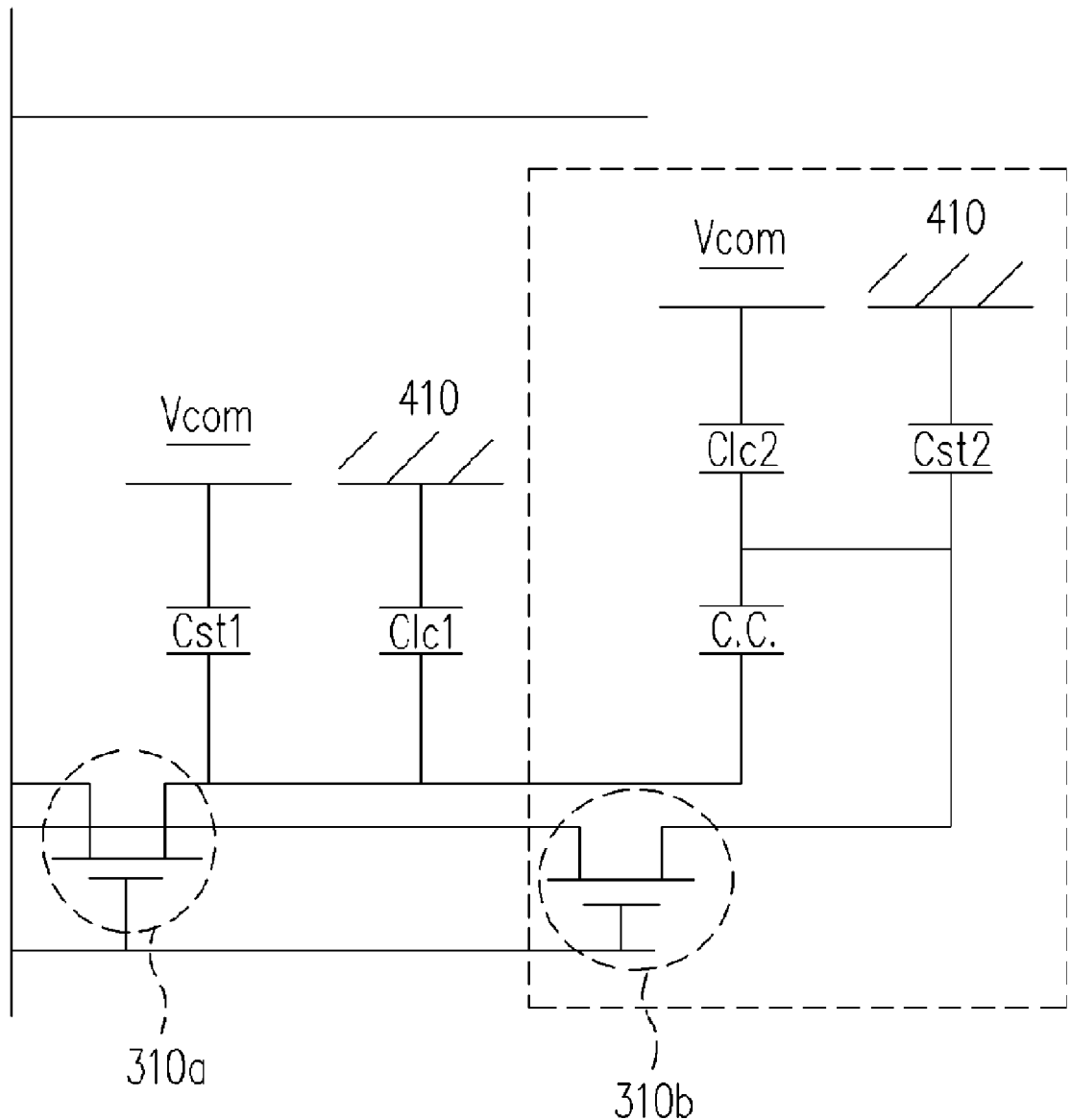
FIG. 7 is a circuit diagram of a pixel structure according to the second embodiment of the present invention.

FIG. 7 is a circuit diagram of a pixel structure according to the second embodiment of the present invention. Referring to FIG. 6 and FIG. 7, to input an image data into the pixel structure 300', a high-voltage Vgh is provided to the scan line 400 for turning on the first gate electrode G1 of the first TFT 310a and the second gate electrode G2 of the second TFT 310b. After the first TFT 310a and the second TFT 310b are turned on, an image data Vdata from the data line 500 will be input into the first pixel electrode 320 through the first source electrode S1 of the first TFT 310a, the first channel layer C1, the first drain electrode D1, the capacitor coupling electrode 340, the upper electrode 342 of the storage capacitor Cst1 and the contact window 344 formed in the passivation layer (not shown in the figure). Thus, the first pixel electrode 320 maintains an image data voltage level Vdata. Meanwhile, the image data Vdata is input into the second pixel electrode 330 through the second source electrode S2 of the second TFT 310b, the second channel layer C2, the second drain electrode D2 and the contact window 345 formed in the passivation layer (not shown in the figure). Thus, the second pixel electrode 330 maintains a voltage level Vcc, and the voltage level Vdata is larger than the voltage level Vcc. Therefore, in response to the same image data Vdata, the first pixel electrode 320 and the second pixel electrode 330 maintain two different voltage levels, respectively. Besides, an LC capacitor (liquid crystal capacitor) Clc1 is formed by the first pixel electrode 320, the liquid crystal layer and the common electrode with a voltage level Vcom on the opposite substrate (for example, color filter substrate). In the meantime, another LC capacitor (liquid crystal capacitor) Clc2 is formed by the second pixel electrode 330, the liquid crystal layer and the common electrode with a voltage level Vcom on the opposite substrate FIG. 6' is a top view of another pixel structure according to the second embodiment of the present invention. Referring to FIGS. 6 and 6', the storage capacitor in the pixel structure 300' of the embodiment can be designed in various types. In the pixel structure 300' shown in FIG. 6, the storage capacitor formed by the upper electrode 342 and the common electrode 410 or the storage capacitor formed by the upper electrode 346 and the common electrode 410 is referred to as an MIM-type capacitor (metal-insulator-metal capacitor). In the pixel structure 300' of FIG. 6', however, the storage capacitor formed by the upper electrode 342 and the common electrode 410 is referred to as an MIM-type capacitor, while the storage capacitor formed by the second pixel electrode 330 and the common electrode 410 is referred to as an MII-type capacitor (metal-insulator-ITO capacitor), wherein ITO is an acronym of indium-tin-oxide. In the pixel structure 300' of FIG. 6', the upper electrode 346 is omitted. Similarly, for those skilled in the art, it is easy to modify the type and the location of the storage capacitor to fit the applications.

In summary, the pixel structure and the active matrix substrate of the present invention has at least the following advantages.

1. The pixel structure and the active matrix substrate of the present invention are able to effectively avoid the image sticking phenomenon.

2. The fabricating method of the pixel structure and the active matrix substrate of the present invention are compatible with the current process and there is no need to significantly modify the current process.

3. The charge releasing device in the pixel structure and the active matrix substrate of the present invention is disposed over the scan line, which does not affect the aperture ratio of the panel.

It will be apparent to those skilled in the art that various modifications and variations can be made to the structure of the present invention without departing from the scope or spirit of the present invention. In view of the foregoing, it is intended that the specification and examples to be considered as exemplary only, with a true scope and spirit of the present invention being indicated by the following claims and their equivalents.

What is claimed is:

1. A pixel structure, electrically connected to a scan line and a data line, comprising:

an active device electrically connected to the scan line and the data line;

a first pixel electrode electrically connected to the data line through the active device;

a second pixel electrode electrically isolated from the first pixel electrode;

a capacitor coupling electrode disposed under the second pixel electrode and electrically connected to the data line through the active device; and a charge releasing device electrically connected to the second pixel electrode.

2. The pixel structure of claim 1, wherein the charge releasing device comprises a capacitor.

3. The pixel structure of claim 2, wherein the capacitor comprises:

an upper electrode electrically connected to the second pixel electrode; and a lower electrode disposed under the upper electrode, wherein the voltage level of the lower electrode and the voltage level of the scan line are substantially identical.

4. The pixel structure of claim 2, wherein the capacitor is formed by a partial region of the scan line and a partial region of the second pixel electrode.

5. The pixel structure of claim 2, wherein the second pixel electrode has a protrusion located over the partial region of the scan line, and the capacitor is formed by the partial region of the scan line and the protrusion.

6. The pixel structure of claim 1, wherein the active device comprises a first thin film transistor (TFT).

7. The pixel structure of claim 6, wherein the first TFT comprises a first gate electrode, a first channel layer, a first source electrode, and a first drain electrode;

wherein the first gate electrode is electrically connected to the scan line, the first source electrode is electrically connected to the data line, and the first drain electrode is electrically connected to the first pixel electrode.

8. The pixel structure of claim 6, wherein the charge releasing device comprises a second thin film transistor (TFT), and the ratio of width over length (W/L) of the second TFT is substantially smaller than the (W/L) of the first TFT.

9. The pixel structure of claim 8, wherein the second TFT comprises a second gate electrode, a second channel layer, a second source electrode, and a second drain electrode, wherein the second gate electrode electrically is connected to the scan line, the second source electrode is electrically connected to the data line, and the second drain electrode is electrically connected to the second pixel electrode.

10. The pixel structure of claim 1, wherein the first pixel electrode and the second pixel electrode have jagged slits.

11. An active matrix substrate, comprising:

a substrate;

a plurality of scan lines disposed on the substrate;

a plurality of data lines disposed on the substrate;

a plurality of pixel structures, each pixel structure being corresponding to one of the scan lines and one of the data lines, and each of the pixel structures comprising:

an active device electrically connected to the scan line and the data line;

a first pixel electrode electrically connected to the data line through the active device;

a second pixel electrode electrically isolated from the first pixel electrode;

a capacitor coupling electrode disposed under the second pixel electrode and electrically connected to the data line through the active device; and a charge releasing device electrically connected to the second pixel electrode.

12. The active matrix substrate of claim 11, wherein the charge releasing device comprises a capacitor.

13. The active matrix substrate of claim 12, wherein the capacitor comprises:
- an upper electrode electrically connected to the second pixel electrode; and
- a lower electrode disposed under the upper electrode, wherein the voltage level of the lower electrode and the voltage level of the scan line are substantially identical.

14. The active matrix substrate of claim 12, wherein the capacitor is formed by a partial region of the scan line and a partial region of the second pixel electrode.

15. The active matrix substrate of claim 12, wherein the second pixel electrode has a protrusion located over the partial region of the scan line, and the capacitor is formed by at least the partial region of the scan line and the protrusion.

16. The active matrix substrate of claim 11, wherein the active device comprises a first thin film transistor (TFT).

17. The active matrix substrate of claim 16, wherein the first TFT comprises a first gate electrode, a first channel layer, a first source electrode, and a first drain electrode; wherein the first gate electrode is electrically connected to the scan line the first source electrode is electrically connected to the data line, and the first drain electrode is electrically connected to the first pixel electrode.

18. The active matrix substrate of claim 16, wherein the charge releasing device comprises a second thin film transistor (TFT), and the ratio of width over length (W/L) of the second TFT is substantially smaller than the (W/L) of the first TFT.

19. The active matrix substrate of claim 18, wherein the second TFT comprises a second gate electrode, a second channel layer, a second source electrode, and a second drain electrode; wherein the second gate electrode is electrically connected to the scan line, the second source electrode is electrically connected to the data line, and the second drain electrode is electrically connected to the second pixel electrode.

20. The active matrix substrate of claim 11, wherein the first pixel electrode and the second pixel electrode have jagged slits.

* * * * *